(12) United States Patent
Noh

(10) Patent No.: US 7,724,576 B2
(45) Date of Patent: May 25, 2010

(54) SOFT PROGRAMMING METHOD OF NON-VOLATILE MEMORY DEVICE

(75) Inventor: Keum-Hwan Noh, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 249 days.

(21) Appl. No.: 12/019,947

(22) Filed: Jan. 25, 2008

(65) Prior Publication Data

US 2009/0122617 A1    May 14, 2009

(30) Foreign Application Priority Data

Nov. 9, 2007    (KR)    ...................... 10-2007-0114337

(51) Int. Cl.
 *G11C 13/00*    (2006.01)
(52) U.S. Cl. .............................. 365/185.18; 35/185.29; 35/185.17
(58) Field of Classification Search ............ 365/185.18, 365/185.29, 185.17
See application file for complete search history.

(56) References Cited

U.S. PATENT DOCUMENTS

| 7,499,338 B2 * | 3/2009 | Ito ........................... 365/185.3 |
| 2009/0103371 A1 * | 4/2009 | Goda et al. ............. 365/185.29 |
| 2009/0122607 A1 * | 5/2009 | Aritome ................ 365/185.03 |

FOREIGN PATENT DOCUMENTS

KR    1020010061404 A    7/2001

* cited by examiner

*Primary Examiner*—Tuan T. Nguyen
(74) *Attorney, Agent, or Firm*—Townsend and Townsend and Crew LLP

(57) ABSTRACT

A non-volatile memory device includes a first cell group including memory cells other than memory cells adjacent to a drain select transistor in a block, and a second cell group including the memory cells adjacent to the drain select transistor in the block. An erase operation is performed on the memory cells in the block. The first cell group is programmed by applying a first soft programming voltage to the first cell group. The second cell group is programmed by applying a second soft programming voltage to the second cell group.

12 Claims, 6 Drawing Sheets

Prior Art

SOFT PROGRAMMING METHOD OF NON-VOLATILE MEMORY DEVICE

CROSS-REFERENCES TO RELATED APPLICATIONS

The present application claims priority to Korean patent application number 10-2007-114337, filed on Nov. 9, 2007, which is incorporated by reference in its entirety.

BACKGROUND OF THE INVENTION

The present invention relates to a soft programming method of a non-volatile memory device.

Recently, there has been an increasing demand for non-volatile memory devices which can be electrically programmed and erased and do not require a refresh function of rewriting data at regular intervals.

A non-volatile memory device generally includes a memory cell array in which cells for storing data are arranged in a matrix form, and a page buffer for writing memory into a cell of the memory cell array or reading memory stored in a cell. The page buffer includes a bit line pair connected to a memory cell, a register for temporarily storing data to be written into the memory cell array, or reading data of a cell from the memory cell array and temporarily storing the read data, a sense node for sensing a voltage level of a bit line or a register, and a bit line selection unit for controlling whether a bit line is connected to the sense node.

Each memory cell of the non-volatile memory device is a device that enables an electrical program and erase operation, and is configured to perform a program and erase operation by changing the threshold voltage of a cell while electrons are moved by a strong electric field applied to a thin oxide layer of about 100 angstroms (hereinafter, referred to as a "tunnel oxide layer").

After an erase operation is performed on the non-volatile memory device, in order to improve distributions of the threshold voltage of the cells, a soft programming operation is performed to raise the threshold voltage of an erase cell. During this soft programming operation, the threshold voltage of the erase cell is further raised because of a Back Pattern Dependence (BPD) effect, FG coupling, a program disturbance phenomenon and/or an interference phenomenon. This results in reduced read margin. The phenomena are particularly severe in cells adjacent to a drain select transistor.

BRIEF SUMMARY OF THE INVENTION

The present invention is directed toward a soft programming method of a non-volatile memory device, in which a soft programming voltage of a different level is applied to the memory cells with the memory cells being divided into two groups.

In one embodiment, a soft programming method of a non-volatile memory device includes providing a first cell group including memory cells other than memory cells adjacent to a drain select transistor in a block, and a second cell group including the memory cells adjacent to the drain select transistor in the block; performing an erase operation on the memory cells included in the block; programming the first cell group by applying a first soft programming voltage to the first cell group; and programming the second cell group by applying a second soft programming voltage to the second cell group.

In another embodiment, a soft programming method of a non-volatile memory device includes providing a first cell group including memory cells other than memory cells adjacent to a source select transistor in a block, and a second cell group including the memory cells adjacent to the source select transistor in the block; performing an erase operation on the memory cells included in the block; programming the first cell group by applying a first soft programming voltage to the first cell group; and programming the second cell group by applying a second soft programming voltage to the second cell group.

In still another embodiment, a soft programming method of a non-volatile memory device includes providing a first cell group including memory cells adjacent to a drain select transistor in a block, a second cell group including memory cells adjacent to a source select transistor in the block, and a third cell group including memory cells other than the memory cells included in the first cell group and the second cell group in the block; performing an erase operation on the memory cells included in the block; applying a first soft programming voltage to the first cell group; applying a second soft programming voltage to the second cell group; applying a third soft programming voltage that is higher than the first and second soft programming voltages to the third cell group; and performing a soft programming operation based on the applied soft programming voltages.

In yet another embodiment, a soft programming method of a non-volatile memory device includes providing a first cell group including memory cells adjacent to a select transistor in a block, and a second cell group including memory cells other than the cells adjacent to the select transistor in the block; performing an erase operation on the memory cells included in the block; and performing programming so that a threshold voltage of the first cell group is higher than a threshold voltage of the second cell group.

In accordance with the present invention, a decrement of the threshold voltage can be reduced by the soft programming operation performed on cells connected to word lines on which the soft programming operation is performed. Accordingly, a sufficient read margin can be secured, and the occurrence of failed cells can be prevented even when an MSB program is performed.

A low soft programming voltage is applied to cells located at the foremost edges in one block (i.e., cells adjacent to a drain select transistor and cells adjacent to a source select transistor). Accordingly, an increment of the threshold voltage due to a soft programming operation can be reduced.

DESCRIPTION OF EMBODIMENTS

Embodiments according to the present invention will be described with reference to the accompanying drawings.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the claims.

Figure 1:
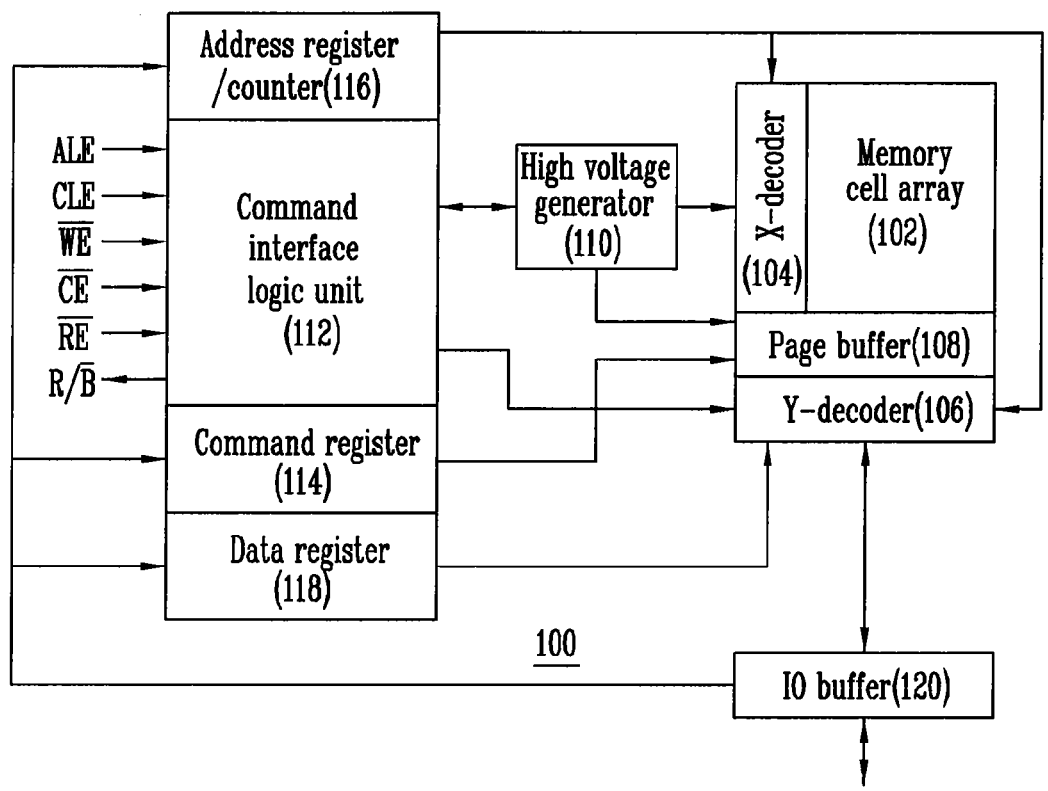
FIG. 1 is a block diagram illustrating a non-volatile memory device to which the present invention is applied.

FIG. 1 is a block diagram illustrating a non-volatile memory device to which the present invention is applied.

A non-volatile memory device 100 includes a memory cell array 102, a page buffer 108, X and Y decoders 104, 106, a high voltage generator 110, a command interface logic unit 112, a command register 114, an address register/counter 116, a data register 118, and an IO buffer 120.

An operation of the non-volatile memory device is described below.

If a chip enable signal $\overline{CE}$ is disabled and a write enable signal $\overline{WE}$ is toggled with respect to the command interface logic unit 112, the command interface logic unit 112 receives a command signal received via the IO buffer 120 and the command register 114 in response thereto, and generates a program command, an erase command, a read command, and so on according to the command. The command signal may include a page program setup code for deciding an operating mode of the non-volatile memory device. An operating status signal R/$\overline{B}$ output from the command interface logic unit 112 is disabled for a certain period of time. An external memory controller (not shown) receives the operating status signal R/$\overline{B}$ and determines that the non-volatile memory device is in an operating status, such as program/erase/read, etc., based on the operating status signal. In other words, while the operating status signal R/$\overline{B}$ is disabled, program/erase/read, etc. is performed on one page of the memory cell array.

The address register/counter 116 receives an address signal received via the IO buffer 120 and generates a row address signal and a column address signal. The address signal corresponds to one of the pages included in one of the memory cells.

The data register 118 temporarily stores various data received via the IO buffer 120 and transfers the data to the Y decoder 106.

The high voltage generator 110 generates bias voltages in response to the program command, the erase command or the read command and supplies the voltages to the page buffer 108, the X decoder 104, etc.

The X decoder 104 supplies the bias voltages, supplied from the high voltage generator 110, to one block of the memory cell array 102 in response to the row address signal.

The Y decoder 106 supplies a data signal to bit lines (not shown), which are shared by the blocks of the memory cell array, through the page buffer in response to the column address signal.

The page buffer 108 latches the data signal received via the IO buffer 120 and the Y decoder 106 and outputs bit lines (not shown), which are shared by the blocks of the memory cell array.

Recently, 2-bits or more of data are stored in the memory cell of the non-volatile memory device, and such a memory device is called an MLC non-volatile memory device.

Figure 2:
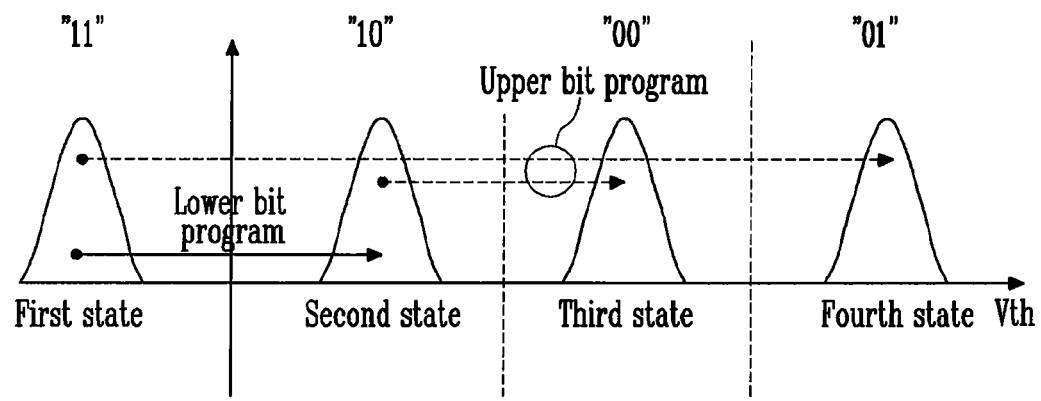
FIG. 2 is a view illustrating distributions of the threshold voltage of respective data of a conventional 2-bit Multi-Level Cell (MLC) non-volatile memory device

FIG. 2 is a view illustrating distributions of the threshold voltage of respective data of a conventional 2-bit MLC non-volatile memory device.

A low bit program is an operation of programming a cell '11' that is in a first state. As a result of the programming, the cell '11' that is in the first state change to a cell '10' that is in a second state.

An upper bit program is an operation of programming the cell '11' that is in the first state or the cell '10' that is in the second state. As a result of the programming, the cells in the first state change to cells '01' in a fourth state, and the cells in the second state change to cells '00', in a third state.

This MLC non-volatile memory device is advantageous in that it can increase data storage capacity significantly because it can store four kinds of data in one cell. However, the MLC non-volatile memory device is disadvantageous in that it is difficult to secure a sufficient read margin when compared with a single level cell non-volatile memory device because it has four kinds of threshold voltage distributions.

To improve threshold voltage distributions of the MLC non-volatile memory device, a soft programming operation is performed.

Figure 3:
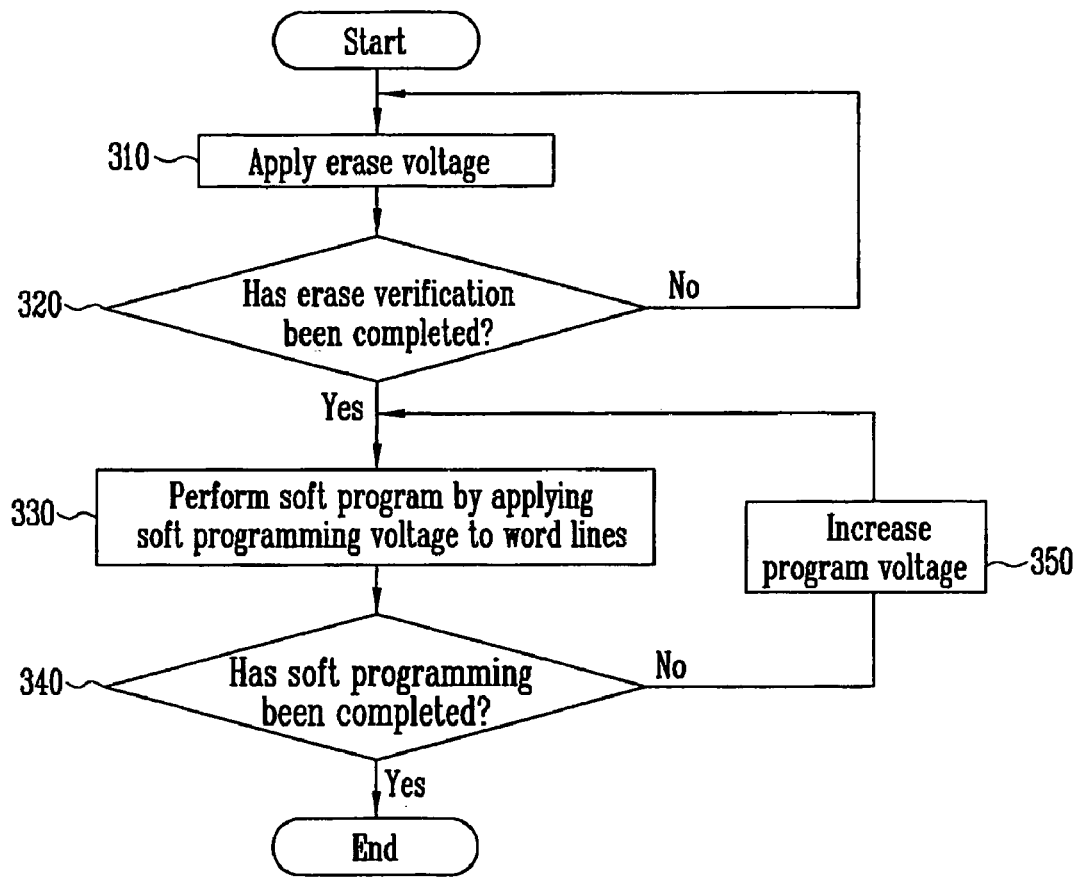
FIG. 3 is a flowchart illustrating a conventional soft programming operation.

FIG. 3 is a flowchart illustrating a conventional soft programming operation.

For an erase operation, an erase voltage of −20V is applied to a TP-Well of the non-volatile memory device and 0V is applied to word lines of a selected block to erase electrons programmed into a floating gate in step 310.

It is verified whether the memory cells have been erased in step 320.

For example, when verifying whether a memory cell string has been erased, a read voltage 0V (i.e., a reference for verification) may be applied to each word line, precharged bit lines may be connected to a cell string, and it may be then determined whether a current path from the bit lines to the cell string has been formed. In the event that one cell is not erased and is programmed at a read voltage or more, it will be determined that the current path has not been formed and the erase operation has not been completed. If, as a result of the verification in step 320, all of the memory cells have not been erased, step 310 is performed repeatedly.

However, if the erase operation has been completed, a soft programming operation is performed in steps 330 to 350.

The soft programming operation is performed by applying a soft programming voltage (e.g., about 12V), lower than a program voltage (e.g., about 20V), to all of the word lines within a block in step 330.

Verification is performed on the soft programming operation on the basis of an erase-verifying voltage EV in step 340.

The erase-verifying voltage EV is a negative voltage of about −1V, and the threshold voltage of the cells rise to −1V due to the soft programming method depending on the verification. If, as a result of the verification in step 340, the soft program has not been completed, the program voltage is slightly increased and the soft programming operation is performed repeatedly in step 350.

However, if, as a result of the verification, the soft program has been completed, i.e., when the threshold voltage of cells have risen to −1V, the soft program is finished.

Figure 4:
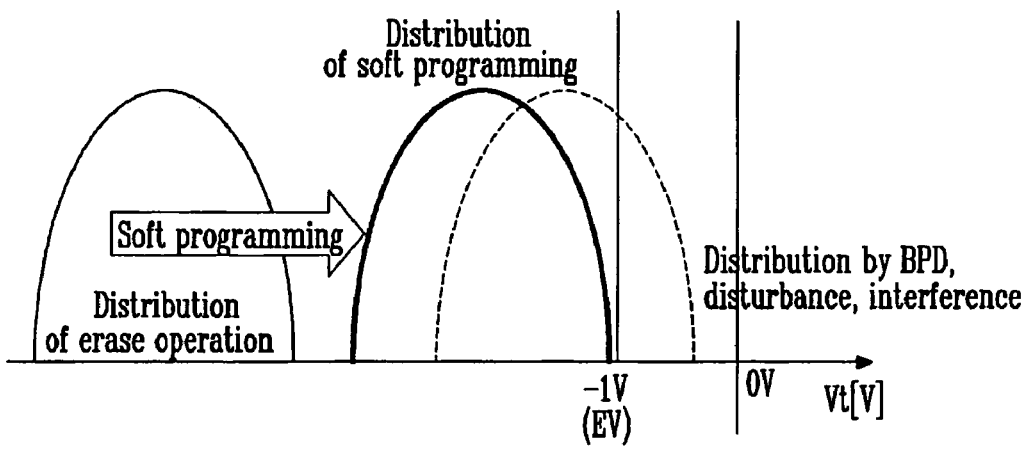
FIG. 4 is a view illustrating distributions of the threshold voltage according to a conventional soft programming operation.

FIG. 4 is a view illustrating distributions of the threshold voltage according to a typical soft programming operation.

In FIG. 4, a state where the above erase verification has been completed is illustrated as distributions after the erase operation. If a soft programming operation is performed on the erased cells, the threshold voltage rises constantly in a positive direction as shown in FIG. 4. However, in the process of sequentially performing the soft program on each word line, the threshold voltage of the erased cells is further increased due to a BPD effect in which the threshold voltage of a cell is increased according to channel resistance, FG coupling, and a program disturbance and/or interference phenomenon. This leads to a reduced read margin. In particular, after the erase/programming operations are repeated, these phenomena become more severe. Consequently, the threshold voltage of the erased cell rises to 0V or higher, causing failure in which the erased cell is recognized as a programmed cell. If this cell experiences MSB programming in a MLC program, the cell is recognized as the programmed cell '10' not the erased cell '11', so the cell is programmed as the state '00' not the state '01'. In particular, this phenomenon is concentrically generated in cells adjacent to a drain select transistor.

Figure 5:
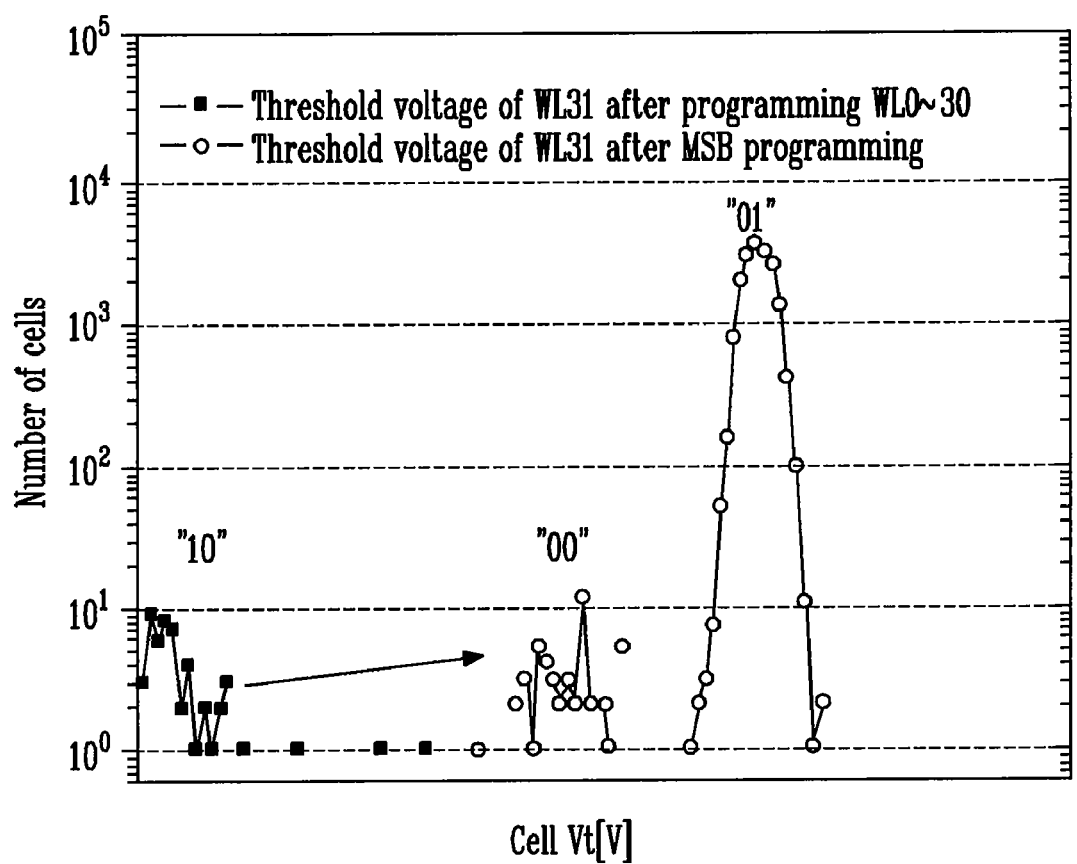
FIG. 5 is a view illustrating distributions of the threshold voltage of cells adjacent to a drain select transistor.

FIG. 5 is a view illustrating distributions of the threshold voltage of cells adjacent to a drain select transistor.

A structure of a memory cell array is first described. The memory cell array includes memory cells for storing data, word lines WL0 to WLn for selecting and activating the memory cells, and bit lines BL for inputting or outputting data to or from the memory cells. The memory cell array has a structure in which the plurality of word lines and the plurality of bit lines are arranged in a matrix form. The memory cell array includes a drain select transistor DSL for selectively connecting bit lines and a memory cell, and a source select transistor SSL for selectively connecting a common source line CSL and a memory cell. A plurality of the memory cells are connected in series between the source select transistor SSL and the drain select transistors DSL, which is referred to as a cell string. The memory cells have gates connected to the word lines, and a collection of memory cells commonly connected to the same word line is called a page. A plurality of strings connected to the respective bit lines are connected to the common source line in parallel, thereby forming a block.

In general, 32 memory cells are included in one cell string. A word line connected a cell adjacent to a source select transistor is a first word line WL0 and a word line connected a cell adjacent to a drain select transistor is a $32^{nd}$ word line WL31.

However, the number '32' is only illustrative to clarify that a cell adjacent to the drain select transistor is the $32^{nd}$ word line WL31, and the number of the word lines may be changed.

Distributions of the threshold voltage of cells connected to the $32^{nd}$ word line after sequentially programming from a page connected to the first word line WL0 to a page connected to the $31^{st}$ word line are described with reference to FIG. 5. From FIG. 5, it can be seen that even after programming (i.e., even in the case of erased cells), cells having the second state '10' appear.

If MSB programming is performed on the cells connected to the $32^{nd}$ word line in this state, the cells must be in the fourth state, but cells having the third state appear. This is because cells having the second state before MSB programming appear.

The distribution state may vary depending on the last word line that has been programmed. That is, when the first word line is the last word line that is programmed, the distribution state of the first word line may become problematic.

To solve this problem, the present invention proposes applying a soft programming voltage of a different level to cells adjacent to a drain select transistor and to cells not adjacent to a drain select transistor.

Figure 6:
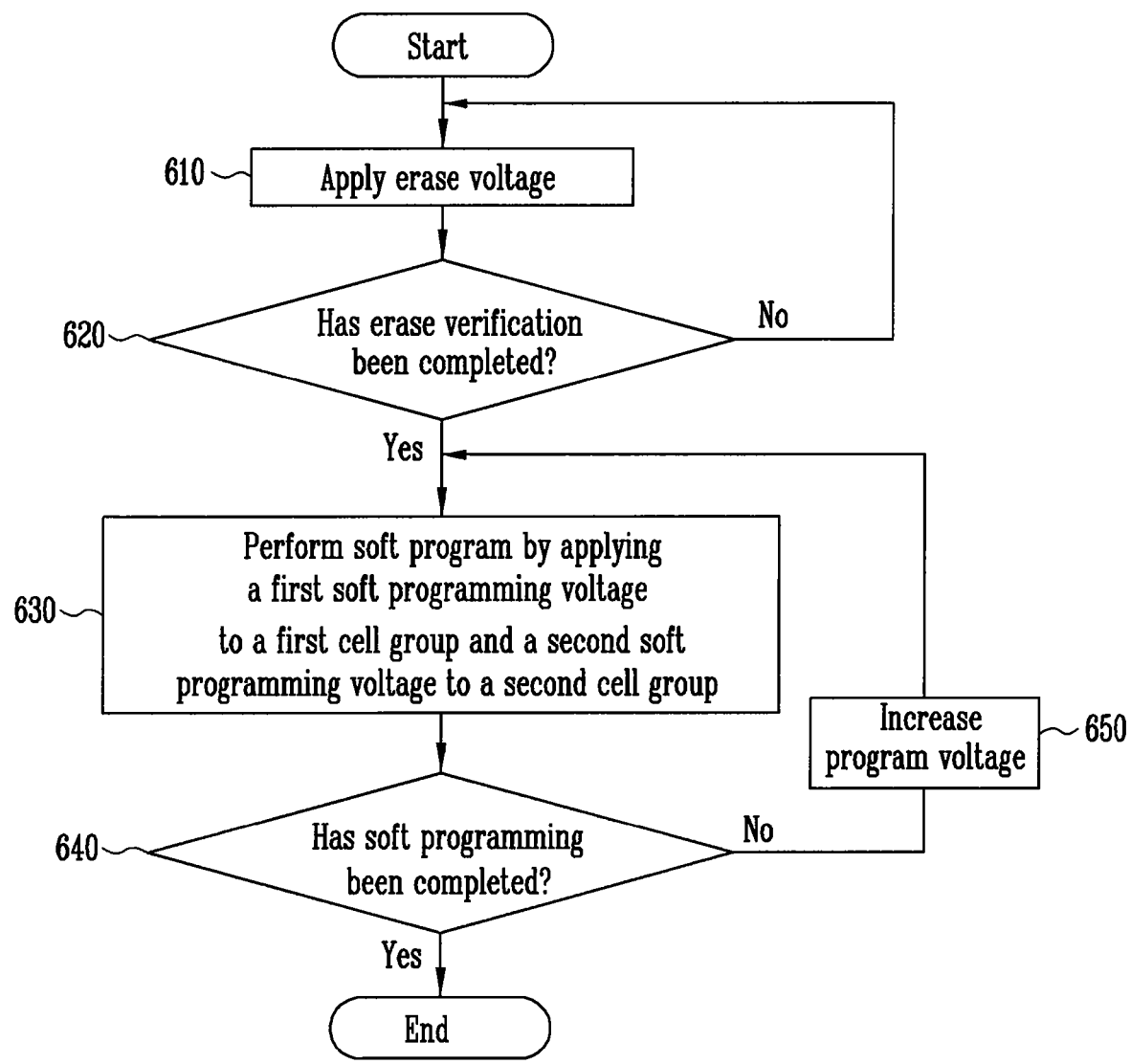
FIG. 6 is a flowchart illustrating a soft programming method according to an embodiment of the present invention.
Figure 7:
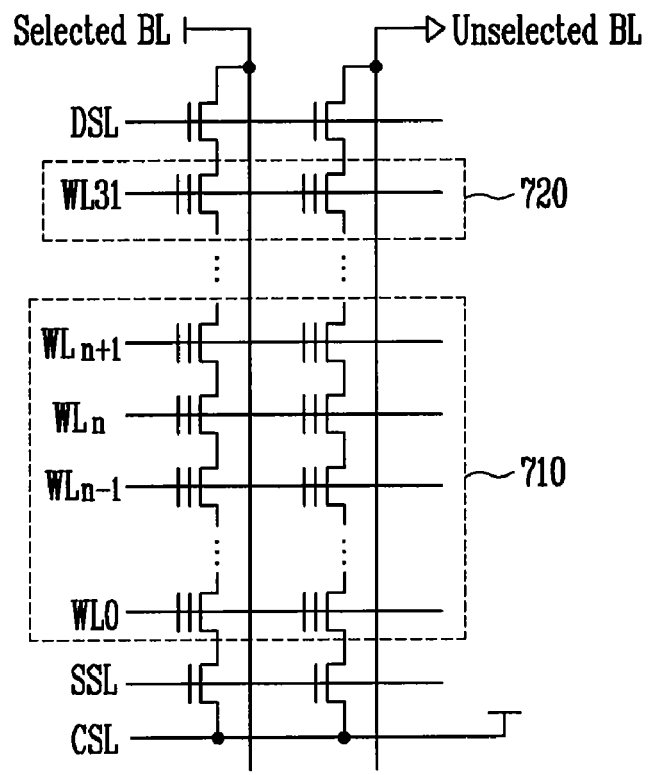
FIG. 7 is a circuit diagram illustrating the soft programming method according to an embodiment of the present invention.

FIG. 6 is a flowchart illustrating a soft programming method according to an embodiment of the present invention. FIG. 7 is a circuit diagram illustrating the soft programming method according to an embodiment of the present invention.

Referring first to FIG. 6, for an erase operation, an erase voltage of −20V is applied to a TP-Well of the non-volatile memory device and 0V is applied to word lines of a selected block to erase electrons programmed in a floating gate in step 610.

It is verified whether all of the memory cells have been erased in step 620.

For example, when verifying whether a memory cell string has been erased, a read voltage 0V (i.e., a reference for verification) may be applied to each word line, precharged bit lines may be connected to a cell string, and it may be determined whether a current path from the bit lines to the cell string has been formed. In the event that at least one cell is not erased and is programmed to at least a read voltage, it will be determined that the current path has not been formed and the erase operation has not been completed. If, as a result of the verification in step 620, all of the memory cells have not been erased, step 610 is performed repeatedly.

However, if the erase operation has been completed, a soft programming operation is performed in steps 630 to 650.

The soft programming operation is performed by applying a first soft programming voltage to a first cell group and a second soft programming voltage, lower than the first soft programming voltage, to a second cell group in step 630.

The first cell group 710 includes cells included in a unit block other than cells adjacent to a drain select transistor DSL. The first cell group 710 is applied with the first soft programming voltage through word lines connected thereto, as shown in FIG. 7.

The second cell group 720 includes cells adjacent to the drain select transistor DSL. The second cell group 720 is applied with the second soft programming voltage through the word line WL31 connected thereto.

A difference between the first soft programming voltage and the second soft programming voltage may be about 1V.

The soft programming operation is performed using an Incremental Step Pulse Program (ISPP) method, and the first and second soft programming voltages are the initial voltages. The following table illustrates voltages applied to the respective cell groups and various transistors during the soft programming voltage and the erase verification operation. From the table, it can be seen that the first soft programming voltage applied to the word line connected to the first cell group is 12 to 14V and the second soft programming voltage applied to the word line connected to the second cell group is 11 to 13V.

| Name | Soft programming | Erase verification |
|---|---|---|
| First cell group | 12-14 V | 0 V |
| Second cell group | 11-13 V | 0 V |
| DSL | VCC | VCC |
| SSL | 0 V | VCC |
| CSL | VCC | 0 V |
| Selected BL | 0 V | ~1 |
| Unselected BL | 0 V | 0 V |
| Bulk | 0 V | 1 V |

Thereafter, verification is performed on the soft programming operation on the basis of an erase-verifying voltage EV in step 640.

The erase-verifying voltage EV has a negative voltage of about −1V, and the threshold voltage of the cells rises to −1V due to the soft programming operation depending on the verification.

Different soft programming voltages are applied to the first cell group and the second cell group. In this case, distributions of the threshold voltage after the soft programming operation differ quite significantly.

If, as a result of the verification in step 640, the soft program has not been completed, the program voltage is increased and the soft programming operation is then performed repeatedly in step 650.

However, if, as a result of the verification, the soft program has been completed (i.e., cells have a threshold voltage that has risen to −1V), the soft program operation is finished.

Figure 8:
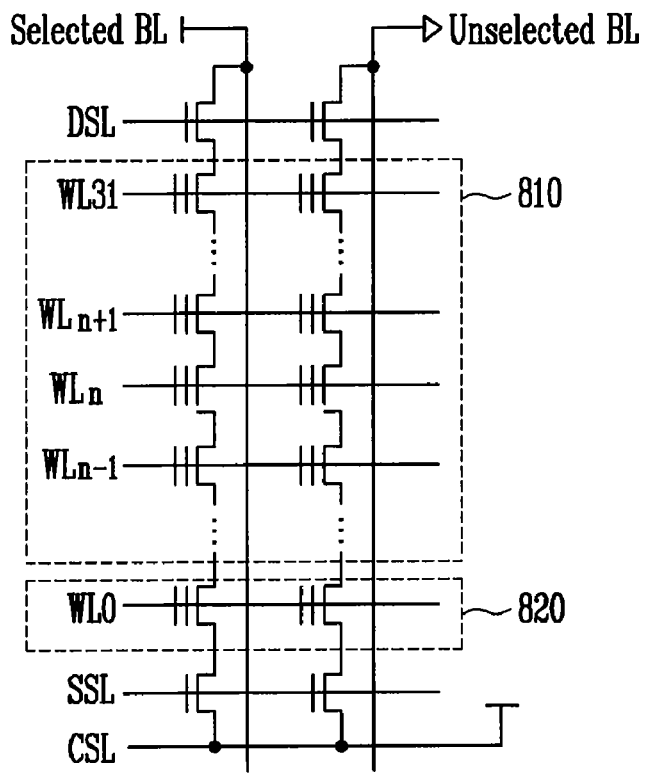
FIG. 8 is a circuit diagram illustrating a soft programming method according to another embodiment of the present invention.

FIG. 8 is a circuit diagram illustrating a soft programming method according to another embodiment of the present invention.

FIG. 7 illustrates a case where programming is sequentially performed from the first word line to the $32^{nd}$ word line, and FIG. 8 illustrates a case where programming is sequentially performed from the $32^{nd}$ word line to the first word line.

In the case of FIG. 8, it is necessary to apply different soft programming voltages to the cell group connected to the first word line.

In other words, a first cell group 810 includes cells in a unit block other than cells adjacent to a source select transistor SSL. The first cell group 810 is applied with a first soft programming voltage through word lines connected thereto, as shown in FIG. 8.

The second cell group 820 includes cells in the unit cell adjacent to the source select transistor SSL. The second cell group 820 is applied with a second soft programming voltage lower than the first soft programming voltage through a word line WL0 connected thereto.

Figure 9:
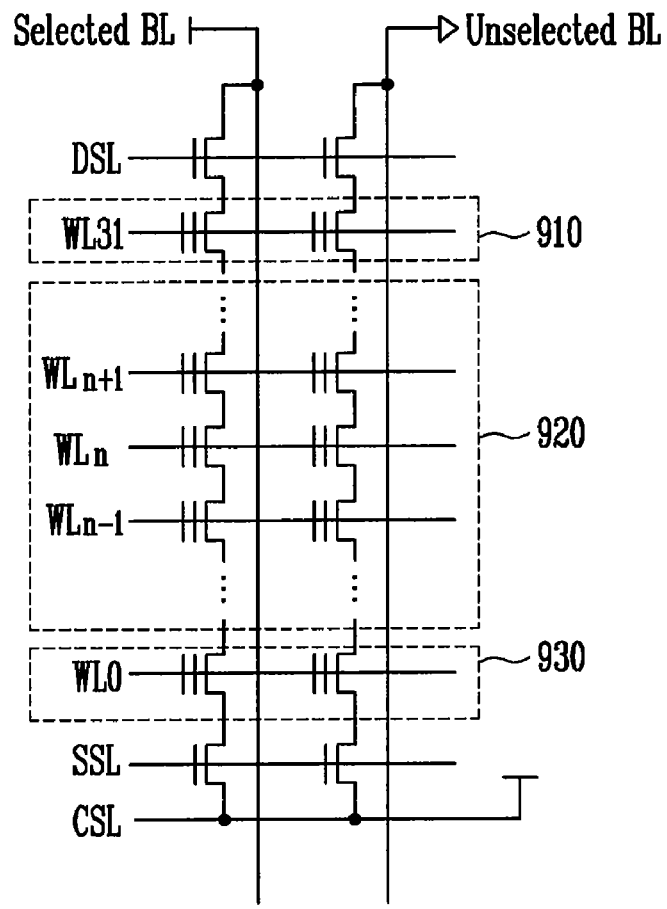
FIG. 9 is a circuit diagram illustrating a soft programming method according to still another embodiment of the present invention.

FIG. 9 is a circuit diagram illustrating a soft programming method according to still another embodiment of the present invention.

As mentioned earlier, FIG. 7 illustrates a case where programming is sequentially performed from the first word line to the $32^{nd}$ word line, and FIG. 8 illustrates a case where programming is sequentially performed from the $32^{nd}$ word line to the first word line. In other words, FIGS. 7 and 8 correspond to a programming direction.

However, the above-mentioned program disturbance can be generated irrespective of a program direction. It is thus necessary to apply a much lower soft programming voltage to cell groups at both sides (i.e., a cell group adjacent to the drain select transistor and a cell group adjacent to the source select transistor) irrespective of the program direction.

Accordingly, FIG. 9 illustrates a case where a much lower soft programming voltage is applied to a cell group adjacent to the drain select transistor and a cell group adjacent to the source select transistor.

A first cell group 910 includes cells in a unit cell adjacent to a drain select transistor DSL. The first cell group 910 is applied with a first soft programming voltage through a word line W31 connected thereto.

A second cell group 930 includes cells in the unit cell adjacent to a source select transistor SSL. The second cell group 930 is applied with a second soft programming voltage through a word line WL0 connected thereto.

A third cell group 920 includes cells in the unit cell other than the cells included in the first and second groups. The third cell group 920 is applied with a third soft programming voltage higher than the first and second soft programming voltages through word lines connected thereto.

A soft programming operation is performed based on the above set soft programming voltages.

Figure 10:
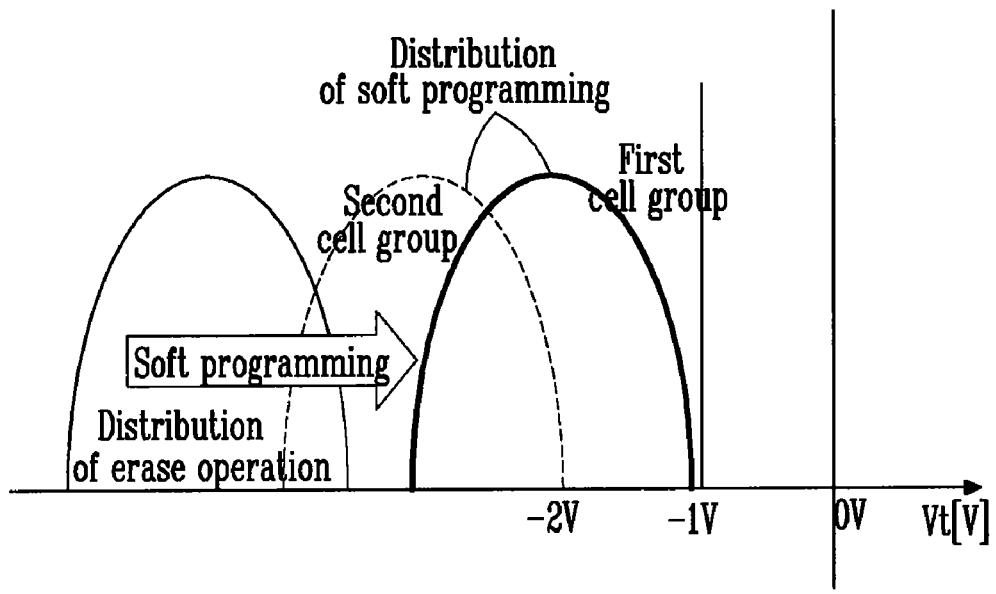
FIG. 10 is a view illustrating distributions of the threshold voltage after the soft programming operation according to an embodiment of the present invention is performed.

FIG. 10 is a view illustrating distributions of the threshold voltage after the soft programming operation according to an embodiment of the present invention is performed.

A state where erase verification has been completed is illustrated as distributions after the erase operation. If a soft programming operation is performed on these erased cells, the threshold voltage rises constantly in a positive direction, as shown in FIG. 10.

However, since different levels of soft programming voltages are applied to the first cell group and the second cell group, the degree which the threshold voltages rise may differ.

Ideally, a difference between distributions of the threshold voltage of the first cell group and distributions of the threshold voltage of the second cell group becomes nearly identical to that between the first soft programming voltage and the second soft programming voltage. Thus, an advantageous read margin of the second cell group can be secured. Accordingly, a problem in which the threshold voltage of an erase cell is further increased due to a BPD effect, FG coupling, a disturbance and/or interference phenomena can be solved.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the claims.

What is claimed is:

1. A soft programming method of a non-volatile memory device, the method comprising:
   providing a first cell group including memory cells other than memory cells adjacent to a drain select transistor in a block, and a second cell group including the memory cells adjacent to the drain select transistor in the block;
   performing an erase operation on the memory cells in the block;
   programming the first cell group by applying a first soft programming voltage to the first cell group; and
   programming the second cell group by applying a second soft programming voltage to the second cell group.

2. The soft programming method of claim 1, wherein during programming of the first cell group, cells adjacent to a source select transistor are first programmed sequentially.

3. The soft programming method of claim 1, wherein the second soft programming voltage is lower than the first soft programming voltage.

4. The soft programming method of claim 1, wherein the first soft programming voltage is approximately 1V higher than the second soft programming voltage.

5. The soft programming method of claim 1, wherein the first soft programming voltage ranges from approximately 12 to 14V.

6. A soft programming method of a non-volatile memory device, the method comprising:
   providing a first cell group including memory cells other than memory cells adjacent to a source select transistor in a block, and a second cell group including the memory cells adjacent to the source select transistor in the block;
   performing an erase operation on the memory cells in the block;
   programming the first cell group by applying a first soft programming voltage to the first cell group; and programming the second cell group by applying a second soft programming voltage to the second cell group.

7. The soft programming method of claim 6, wherein during programming of the first cell group, cells adjacent to a drain select transistor are first programmed sequentially.

8. The soft programming method of claim 6, wherein the second soft programming voltage is lower than the first soft programming voltage.

9. The soft programming method of claim 6, wherein the first soft programming voltage is approximately 1V higher than the second soft programming voltage.

10. The soft programming method of claim 6, wherein the first soft programming voltage ranges from approximately 12 to 14V.

11. A soft programming method of a non-volatile memory device, the method comprising:
   providing a first cell group including memory cells adjacent to a drain select transistor in a block, a second cell group including memory cells adjacent to a source select transistor in the block, and a third cell group including memory cells other than the memory cells included in the first cell group and the second cell group in the block;
   performing an erase operation on the memory cells in the block;
   applying a first soft programming voltage to the first cell group;
   applying a second soft programming voltage to the second cell group; and
   applying a third soft programming voltage to the third cell group, wherein the third soft programming voltage is higher than the first and second soft programming voltages.

12. A soft programming method of a non-volatile memory device, the method comprising:
   providing a first cell group including memory cells adjacent to a select transistor in a block, and a second cell group including memory cells other than the cells adjacent to the select transistor in the block;
   performing an erase operation on the memory cells in the block; and
   performing programming so that a threshold voltage of the first cell group is higher than a threshold voltage of the second cell group.

\* \* \* \* \*